(12) United States Patent
Gallagher et al.

(10) Patent No.: US 7,865,805 B1
(45) Date of Patent: Jan. 4, 2011

(54) MULTIPLE BIT UPSET INSENSITIVE ERROR DETECTION AND CORRECTION CIRCUIT FOR FIELD PROGRAMMABLE GATE ARRAY BASED ON STATIC RANDOM ACCESS MEMORY BLOCKS

(75) Inventors: Timothy C. Gallagher, Littleton, CO (US); William T. Horn, Centennial, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 983 days.

(21) Appl. No.: 11/710,437

(22) Filed: Feb. 26, 2007

(51) Int. Cl.
*G11C 29/00* (2006.01)
(52) U.S. Cl. ...................................... 714/773
(58) Field of Classification Search .................. 714/746, 714/725, 763, 773
See application file for complete search history.

(56) References Cited

U.S. PATENT DOCUMENTS

| | | | |
|---|---|---|---|
| 5,079,693 A | 1/1992 | Miller | |
| 6,219,282 B1 * | 4/2001 | Tanaka | 365/185.33 |
| 6,778,454 B2 | 8/2004 | Duh et al. | |
| 6,934,198 B1 | 8/2005 | Lowe et al. | |
| 7,096,406 B2 * | 8/2006 | Kanazawa et al. | 714/763 |
| 7,353,356 B2 | 4/2008 | Shirota | |
| 7,394,710 B1 | 7/2008 | Gallagher | |
| 7,574,554 B2 * | 8/2009 | Tanaka et al. | 711/103 |
| 7,596,744 B1 * | 9/2009 | Kow et al. | 714/819 |
| 7,689,889 B2 * | 3/2010 | Cohen | 714/759 |

* cited by examiner

*Primary Examiner*—Shelly A Chase
(74) *Attorney, Agent, or Firm*—McDermott Will & Emery LLP

(57) ABSTRACT

A method for detecting and correcting bit errors. The method includes the steps of receiving original data, partitioning the memory storage into a first portion and a second portion, storing the original data in the first portion of the memory buffer, modifying the original data into modified data, storing the modified data in the second portion of the memory buffer, comparing the original data with the modified data, combining the original data and the modified data to create a final data stream, and outputting the final data stream. The method may further include the step of calculating and storing parity data.

14 Claims, 8 Drawing Sheets

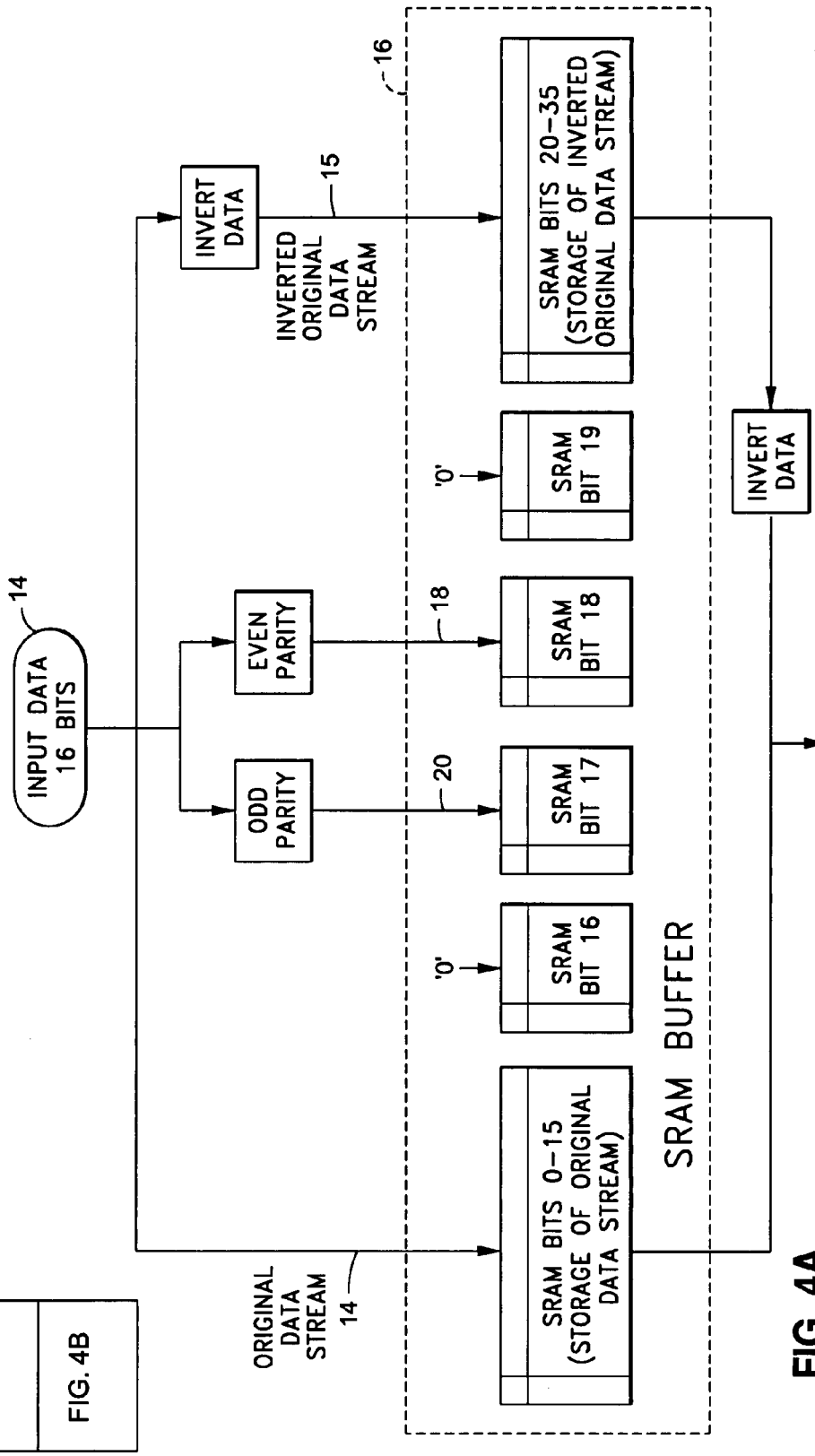

MULTIPLE BIT UPSET INSENSITIVE ERROR DETECTION AND CORRECTION CIRCUIT FOR FIELD PROGRAMMABLE GATE ARRAY BASED ON STATIC RANDOM ACCESS MEMORY BLOCKS

CROSS-REFERENCE TO RELATED APPLICATIONS

Not applicable.

FEDERALLY SPONSORED RESEARCH OR DEVELOPMENT

Not applicable.

TECHNICAL FIELD

The present invention relates to methods and systems for bit upset error detection, and in particular to methods for detecting and correcting multiple bit upset errors in field programmable gate arrays, based on static random access memory blocks.

BACKGROUND OF THE INVENTION

Systems exposed to the harsh environments of space must be able to withstand extreme conditions and operate without losing any of their functions or capabilities. Specifically, space based systems must operate in an environment in which the effects of radiation may compromise the operation of conventional integrated circuits.

Four potential problems may arise due to the effects of radiation. Three of these problems can permanently damage integrated circuits, while the fourth problem may be remedied.

First, total dose radiation caused by the cumulative effects of particles striking an integrated circuit can permanently damage the integrated circuit. Second, the radiation dose rate caused by burst radiation may permanently damage the integrated circuit. Third, displacement damage resulting from nuclear interactions, namely scattering that causes semiconductor defects, can cause permanent damage to integrated circuits. Fourth, single event upsets (SEU or SEUs) can cause a change of state (usually in a memory bit). SEUs do not, however, cause permanent damage.

An SEU is a phenomenon in which radiation impinging upon integrated circuits causes errors, such as changed bits, malfunctions, or failures. The radiation-induced errors in microelectronic circuits are caused when charged particles from radiation belts or cosmic rays lose energy by ionizing the medium through which they pass. These charged particles leave behind electron-hole pairs. SEUs occur when energetic particles deposit charge into memory circuits, causing stored data to change state (i.e., from a "1" to a "0," or vice versa). The errors are soft errors, and are non-destructive.

An SEU typically appears as a transient pulse in logic or support circuitry, or as bit flips in memory cells or registers. Multiple-bit SEUs may also occur. In a multiple-bit SEU, a single ion hits two or more bits, causing simultaneous errors. A multiple bit SEU cannot generally be corrected by single-bit error detection and correction (EDAC) codes and mechanisms. Traditional EDAC codes are useful strictly for the correction of single bit upsets.

However, as the size of devices and their circuits shrinks, radiation testing establishes that adjacent multiple bit upsets may arise in memory cells, and thereby invalidate traditional, simple EDAC codes. Further, as circuits and transistor volumes shrink, relatively smaller total charges are needed to upset a circuit element. Even protons moving through the circuit may deposit sufficient charge to disrupt sensitive locations.

The most common approach for correcting SEUs is the use of triplicated-redundant information storage or error-checking circuitry. For example, a technique known as "voting logic" can be used to catch and correct potential errors in latches. With this technique, a single latch does not effect a change in bit state; rather, several identical latches are queried, and the state will only change if the majority of latches are in agreement. Thus, a single latch error will be "voted away" by the others.

Previous attempts at detection and correction of multiple bit upsets involved triplication of components, or a revised, complex, and slow EDAC scheme. Previous attempts would triplicate the storage memory used in the field programmable gate array (FPGA), and majority vote between the three, to determine the proper set of data. Other complex algorithms were also developed. However, these algorithms would slow down the run time of the FPGA, in that they required multiple levels of comparison before a definitive final output could be determined.

The term 'field programmable gate array' generally refers to semiconductor device containing programmable logic components and programmable interconnects. The programmable logic components can be programmed to duplicate the functionality of basic logic gates such as AND, OR, XOR, NOT, or more complex combinational functions such as decoders or simple math functions.

An FPGA operates by taking a data signal, processing the data through programmed logic, and then outputting a resulting data signal. The device is similar to the gate array. The device is shipped to the user with general-purpose, pre-fabricated metallization, and it may have variable length segments or routing tracks. The device is programmed by turning on switches, which make connections between circuit nodes and the metal routing tracks. The connection may be made by an antifuse, or by a transistor switch (which is controlled by a programmable memory element). The transistor switch may be controlled by an SRAM cell or an EPROM/EEPROM/Flash cell. However, for space based or high-reliable systems, radiation effects are a major concern when using FPGAs.

The present invention solves problems, including but not limited to those discussed above, and provides advantages and aspects not provided by prior systems.

SUMMARY OF THE INVENTION

The present relates to enhanced bit error detection and correction and, more particularly detecting and correcting multiple bit upset errors in field programmable gate arrays, based on static random access memory blocks.

Based on the foregoing discussion, it is appreciated that there presently exists a need in the art for a computer system and a corresponding operating method which overcomes the above-described deficiencies of the prior art. The present invention overcomes several key drawbacks and shortcomings of known bit detection and correction techniques, particularly with regard to the inefficient detection and correction of multiple bit upsets.

It is a feature and advantage of the present invention to provide a bit error detection and correction technique that improves efficiency of the detection and correction, by reducing the amount of hardware needed for the detection and correction. As such, the present invention optimizes the speed of the detection and correction, and reduces the time required to traditionally detect and correct multiple bit upsets.

It is a further feature and advantage of the invention to detect and correct bit errors in a stream of bits, utilizing a portioned memory buffer to store both the stream of bits, and a modified version of the stream of bits so that they may be compared with each other upon output. Following a comparison of the streams of data, and possibly parity bits calculated thereon, it is possible to construct a stream of data bits that will be the same as the original data stream and will not contain single or multiple bit upsets.

According to one aspect, the present invention is a method for correcting bit errors. The method includes the steps of receiving original data, the original data having multiple bits, partitioning a memory buffer into multiple portions, storing the original data in a portion of the memory buffer, modifying the original data to create modified data, storing the modified data in another portion of the memory buffer, and comparing the original data stored in the memory buffer with the modified data stored in the memory buffer. The method further includes the steps of combining the original data and the modified data to create a final data stream, and outputting the final data stream.

According to a second aspect, the present invention is a computer-readable storage medium in which is stored a program to detect and correct bit errors. The program includes codes for permitting the computer to perform a receiving step for receiving original data, the original data having multiple bits, a partitioning step for partitioning a memory buffer into multiple portions, where the memory buffer is an SRAM buffer, a storing step for storing the original data in a portion of the memory buffer, a modifying step for modifying the original data into modified data, and another storing step for storing the modified data in another portion of the memory buffer. The program further includes codes for permitting the computer to perform a comparing step for comparing the original data stored in a portion of the memory buffer with the modified data stored in another portion of the memory buffer, a combining step for combining the original data and the modified data to create a final data stream, and an outputting step for outputting the final data stream.

According to a third aspect, the present invention is a computer-readable storage medium in which is stored a program to correct bit errors. The program includes codes for permitting the computer to perform a receiving step for receiving original data, the original data having multiple data bits, a calculating step for calculating an even parity bit and an odd parity bit based on the original data, a storing step for storing the original data in a memory buffer, another calculating step for calculating a second even parity bit and a second odd parity bit based on the stored original data. The program further includes codes for permitting the computer to perform a comparing step on a reconfigurable computing device, for comparing the first even parity bit with the second even parity bit, comparing the first odd parity bit with the second odd parity bit, and an outputting step for outputting a final data stream.

In the following description of the preferred embodiment, reference is made to the accompanying drawings that form part thereof, and in which is shown by way of illustration a specific embodiment in which the invention may be practiced. It is to be understood that other embodiments may be utilized and changes may be made without departing from the scope of the present invention.

BRIEF DESCRIPTION OF THE DRAWINGS

To understand the present invention, it will now be described by way of example, with reference to the accompanying drawings.

DETAILED DESCRIPTION

This invention is susceptible to many different forms of embodiments. The drawings and descriptions of this invention are merely to be considered as an example of the invention. The drawings, descriptions, and examples discussed in this specification are not intended to limit the broadest aspects of the invention.

The present invention provides an enhanced multi-bit insensitive error detection and correction method which increases detection and correction efficiency. In particular, the present invention provides a detection and correction mechanism which stores both the original data and a modified form of the original data on the same memory buffer which reduces the amount of hardware required to store the data stream in a form that may be checked for errors, resulting in more efficient error detection and correction.

Figure 5:
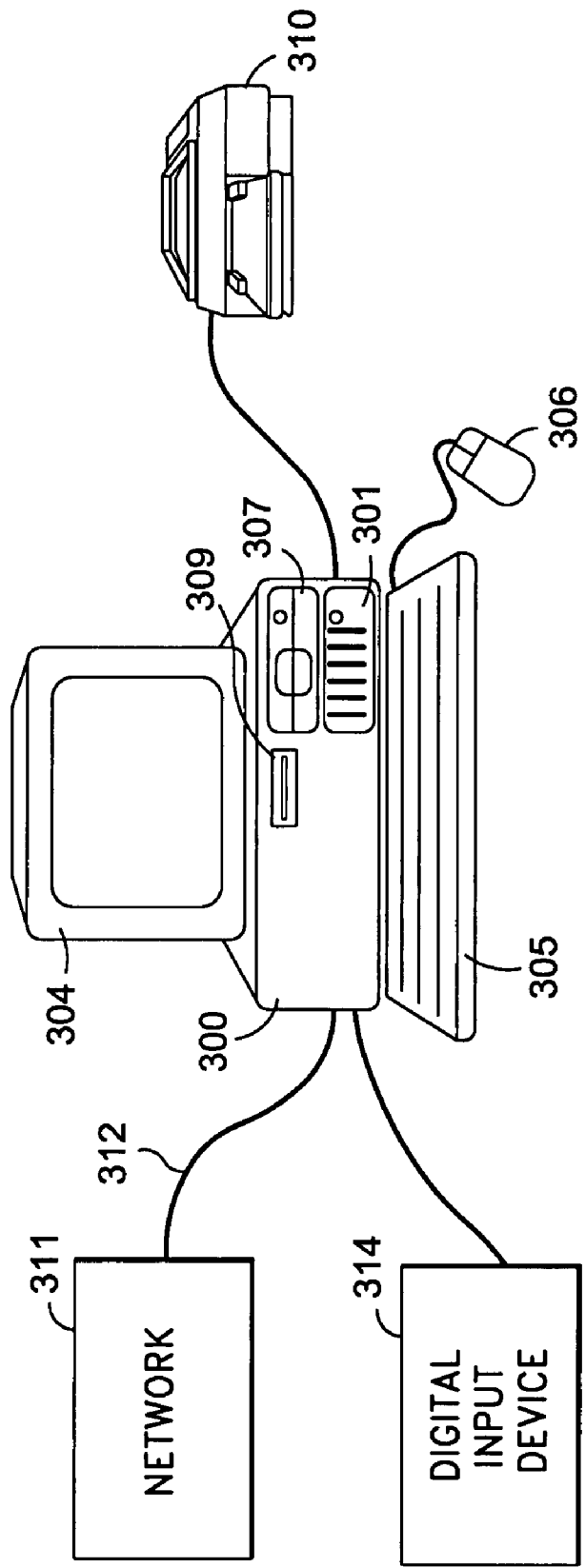
FIG. 5 depicts the exterior appearance of one embodiment of a system housing the present invention.

FIG. 5 depicts the exterior appearance of one embodiment of a system housing the present invention. Computer system 300 includes computer-readable storage medium, such as fixed disk drive 301, in which is stored a program for compressing and/or reconstructing image data. As shown in FIG. 5, the hardware environment can include computer system 300, display monitor 304 for displaying text and images to a user, keyboard 305 for entering text data and user commands into computer system 300, mouse 306 for pointing, selecting and manipulating objects displayed on display monitor 304, fixed disk drive 301, removable disk drive 307, tape drive 309, hardcopy output device 310, computer network 311, computer network connection 312, and digital input device 314.

Display monitor 304 displays the graphics, images, and text that comprise the user interface for the software applications used by the present invention, as well as the operating system programs necessary to operate computer system 300. A user of computer system 300 uses keyboard 305 to enter commands and data to operate and control the computer operating system programs as well as the application programs. The user uses mouse 306 to select and manipulate graphics and text objects displayed on display monitor 304 as part of the interaction with and control of computer system 300 and applications running on computer system 300. Mouse 306 may be any type of pointing device, including a joystick, a trackball, or a touch-pad, without departing from the scope of the present invention. Furthermore, digital input device 314 allows computer system 300 to capture digital images, and is a scanner, digital camera or digital video camera.

The enhanced image compression mechanism application programs are stored locally on computer readable memory media, such as fixed disk drive 301. In a further arrangement, fixed disk drive 301 itself comprises a number of physical drive units, such as a redundant array of independent disks ("RAID"). In an additional arrangement, fixed disk drive 301 is a disk drive farm or a disk array that is physically located in a separate computing unit. Such computer readable memory media allow computer system 300 to access image data, image compression application data, computer-executable process steps, application programs and the like, stored on removable and non-removable memory media.

Network interface 312 is a modem connection, a local-area network ("LAN") connection including the Ethernet, or a broadband wide-area network ("WAN") connection such as a digital subscriber line ("DSL"), cable high-speed internet connection, dial-up connection, T-1 line, T-3 line, fiber optic connection, or satellite connection. Network 311 is a LAN network, however in further arrangements of the present invention network 311 is a, corporate or government WAN network, or the Internet.

Removable disk drive 307 is a removable storage device that is used to off-load data from computer system 300 or upload data onto computer system 300. Removable disk drive 307 is a floppy disk drive, an IOMEGA® ZIP® drive, a compact disk-read only memory ("CD-ROM") drive, a CD-Recordable drive ("CD-R"), a CD-Rewritable drive ("CD-RW"), a DVD-ROM drive, flash memory, a Universal Serial Bus ("USB") flash drive, pen drive, key drive, or any one of the various recordable or rewritable digital versatile disk ("DVD") drives such as the DVD-Recordable ("DVD-R" or "DVD+R"), DVD-Rewritable ("DVD-RW" or "DVD+RW"), or DVD-RAM. Operating system programs, applications, and various data files, such as image data files or image compression application programs, are stored on disks. The files are stored on fixed disk drive 301 or on removable media for removable disk drive 307 without departing from the scope of the present invention.

Tape drive 309 is a tape storage device that is used to off-load data from computer system 300 or upload data onto computer system 300. Tape drive 309 is a quarter-inch cartridge ("QIC"), 4 mm digital audio tape ("DAT"), or 8 mm digital linear tape ("DLT") drive.

Hardcopy output device 310 provides an output function for the operating system programs and applications including the enhanced image compression mechanism. Hardcopy output device 310 is a printer or any output device that produces tangible output objects, including image data or graphical representations of image data. While hardcopy output device 310 is preferably directly connected to computer system 300, it need not be. For instance, in an alternate arrangement of the invention, hardcopy output device 310 is connected via a network interface (e.g., wired or wireless network, not shown).

Figure 1:
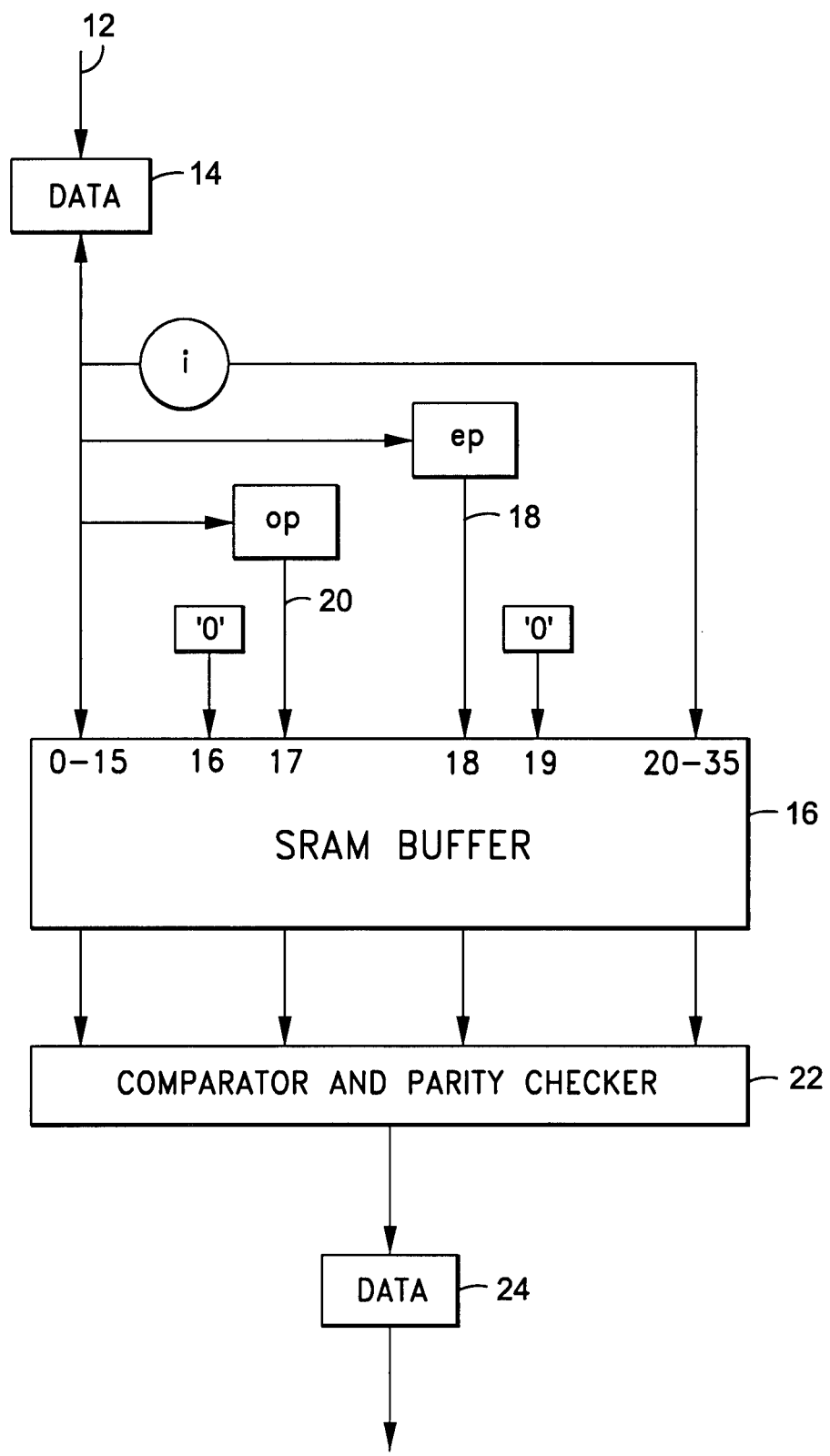
FIG. 1 is a simplified schematic diagram, illustrating a system for multiple bit error detection and correction, according to the present invention.

Although computer system 300 is illustrated in FIG. 5 as a desktop PC, in further arrangements of the present invention computer system 300 is a laptop, a workstation, a midrange computer, a mainframe, an embedded system, or a proprietary system. FIG. 1 illustrates a multi-bit upset insensitive error detection and correction system 10, according to a first embodiment of the invention. The system 10 has an input 12 to receive up to 16 bits of packed data. The number of bits may be extended an additional embodiment as known by those skilled in the art.

Figure 6:
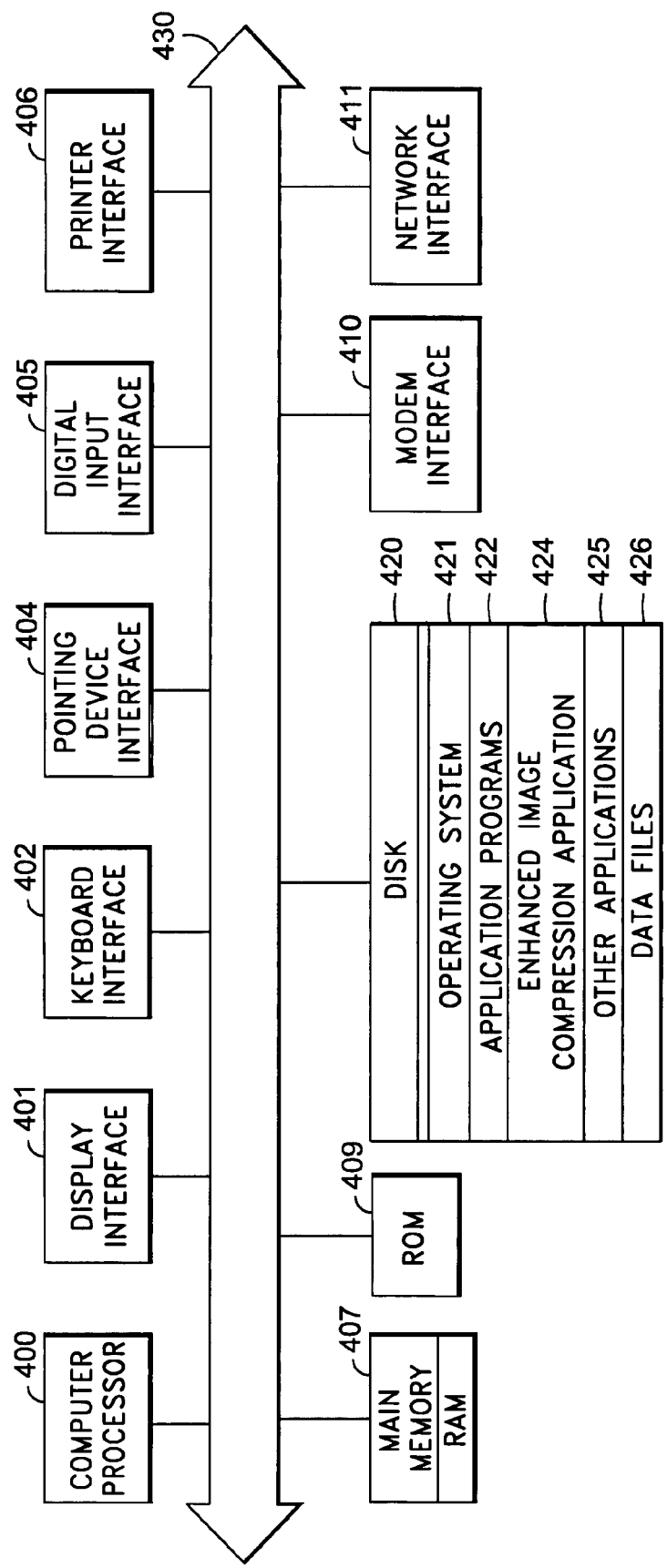
FIG. 6 depicts an example of an internal architecture of the FIG. 5 embodiment; and, FIG. 7 is a flow diagram depicting an example of an improved process for detecting and correcting bit errors, according to the present invention.

FIG. 6 depicts an example of an internal architecture of the FIG. 5 embodiment. The computing environment includes computer processor 400 where the computer instructions that comprise an operating system or an application, including the improved image compression mechanism, are processed; display interface 401 which provides a communication interface and processing functions for rendering graphics, images, and texts on display monitor 304; keyboard interface 402 which provides a communication interface to keyboard 305; pointing device interface 404 which provides a communication interface to mouse 306 or an equivalent pointing device; digital input interface 405 which provides a communication interface to digital input device 314; hardcopy output device interface 406 which provides a communication interface to hardcopy output device 310; random access memory ("RAM") 407 where computer instructions and data are stored in a volatile memory device for processing by computer processor 400; read-only memory ("ROM") 409 where invariant low-level systems code or data for basic system functions such as basic input and output ("I/O"), startup, or reception of keystrokes from keyboard 305 are stored in a non-volatile memory device; disk 420 which can comprise fixed disk drive 301 and removable disk drive 307, where the files that comprise operating system 421, application programs 422 (including enhanced image compression application 424 and other applications 425) and data files 426 are stored; modem interface 410 which provides a communication interface to computer network 311 over a modem; and computer network interface 411 which provides a communication interface to computer network 311 over a computer network connection 312. The constituent devices and computer processor 400 communicate with each other over computer bus 430.

RAM 407 interfaces with computer bus 430 so as to provide quick RAM storage to computer processor 400 during the execution of software programs such as the operating system application programs, and device drivers. More specifically, computer processor 400 loads computer-executable process steps from fixed disk drive 301 or other memory media into a field of RAM 407 in order to execute software programs. Data, including data relating to the image compression, is stored in RAM 407, where the data is accessed by computer processor 400 during execution.

Also shown in FIG. 6, disk 420 stores computer-executable code for a windowing operating system 421, application programs 422 such as word processing, spreadsheet, presentation, graphics, image processing, gaming, or other applications. Disk 420 also stores the enhanced image compression application 424 which utilizes Hilbert curve scanning of quantized DCT coefficients to compress image data or reconstruct compressed image data.

Computer processor 400 is one of a number of high-performance computer processors, including an INTEL® or AMD® processor, a POWERPC® processor, a MIPS® reduced instruction set computer ("RISC") processor, a SPARC® processor, a HP ALPHASERVER® processor or a proprietary computer processor for a mainframe, without departing from the scope of the present invention. In an additional arrangement, computer processor 400 in computer system 300 is more than one processing unit, including a multiple CPU configuration found in high-performance workstations and servers, or a multiple scalable processing unit found in mainframes.

Operating system 421 is one of a number of commonly used operating systems, including MICROSOFT® WINDOWS NT®/WINDOWS® 2000/WINDOWS® XP Workstation; WINDOWS NT®/WINDOWS® 2000/WINDOWS® XP Server; a variety of UNIX®-flavored operating systems, including AIX® for IBM® workstations and servers, SUNOS® for SUN® workstations and servers, LINUX® for INTEL® CPU-based workstations and servers, HP UX WORKLOAD MANAGER® for HP® workstations and servers, IRIX® for SGI® workstations and servers, VAX/VMS for Digital Equipment Corporation computers, OPENVMS® for HP ALPHASERVER®-based computers, MAC OS® X for POWERPC® based workstations and servers; or a proprietary operating system for mainframe computers.

While FIGS. 5 and 6 illustrate a preferred embodiment of a computing system that executes program code, or program or process steps, configured to perform multi-bit insensitive error detection and correction, other types of computing systems may be used as well including performing the steps using multiple logic gates as known in the art.

Figure 7:
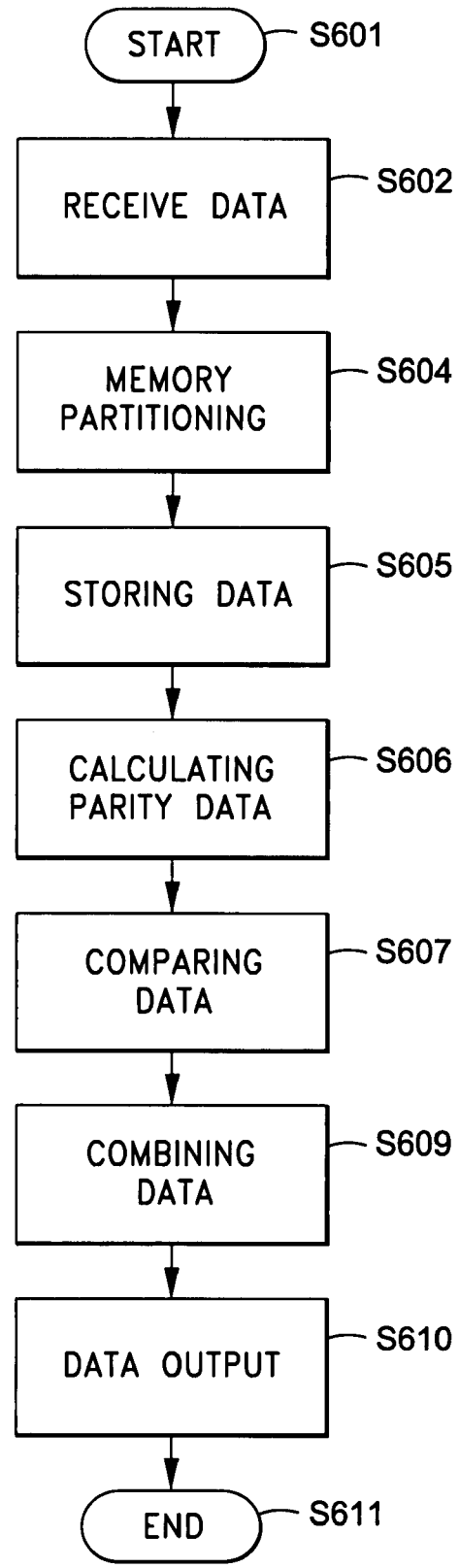

FIG. 7 is a flow diagram depicting the improved process for bit error detection and correction, according to the present invention. Briefly, the method includes the steps of receiving original data, partitioning the memory storage into a first portion and a second portion, storing the original data in the first portion of the memory buffer, modifying the original data into modified data, storing the modified data in the second portion of the memory buffer, comparing the original data with the modified data, combining the original data and the modified data to create a final data stream, and outputting the final data stream. The method may further include the step of calculating parity data.

In more detail the error detection process begins (Step S601), and original data 14 is input (Step S602). The original data 14 is comprised of a series of bits. A bit refers to a digit in the binary numeral system, which consists of base 2 digits. In base 2, there are only two possible binary digit values, 0 or 1. These binary digits are commonly used as the basic unit of information storage and communication in digital computing and digital information theory. The bit is also a unit of measurement, the information capacity of one binary digit.

In Step S604, a static random access memory (SRAM) buffer 16 may be partitioned into at least a first portion and a second portion. SRAM is a type of semiconductor memory. The word 'static' indicates that the memory retains its contents as long as power remains applied. Each bit in an SRAM is stored on four transistors that form two cross-coupled inverters. This storage cell has two stable states, which are used to denote binary values 0 and 1. Two additional access transistors serve to control the access to a storage cell during read and write operations.

SRAM differs from dynamic random access memory (DRAM), which needs to be refreshed. Random access means that locations in the memory can be written to, or read from, in any order, regardless of the memory location that was last accessed.

During read accesses, the bit lines are actively driven high and low by the inverters in the SRAM cell. This improves SRAM speed, as compared to the speed of DRAMs. The symmetric structure of SRAMs also allows for differential signaling, which makes small voltage swings more easily detectable. The partitioning of the SRAM buffer 16, allows for one SRAM buffer to hold multiple copies of the original data 14, and allows the error detection and correction to occur on a smaller system and a system that may operate faster because of the presence of less hardware.

Figure 4B:
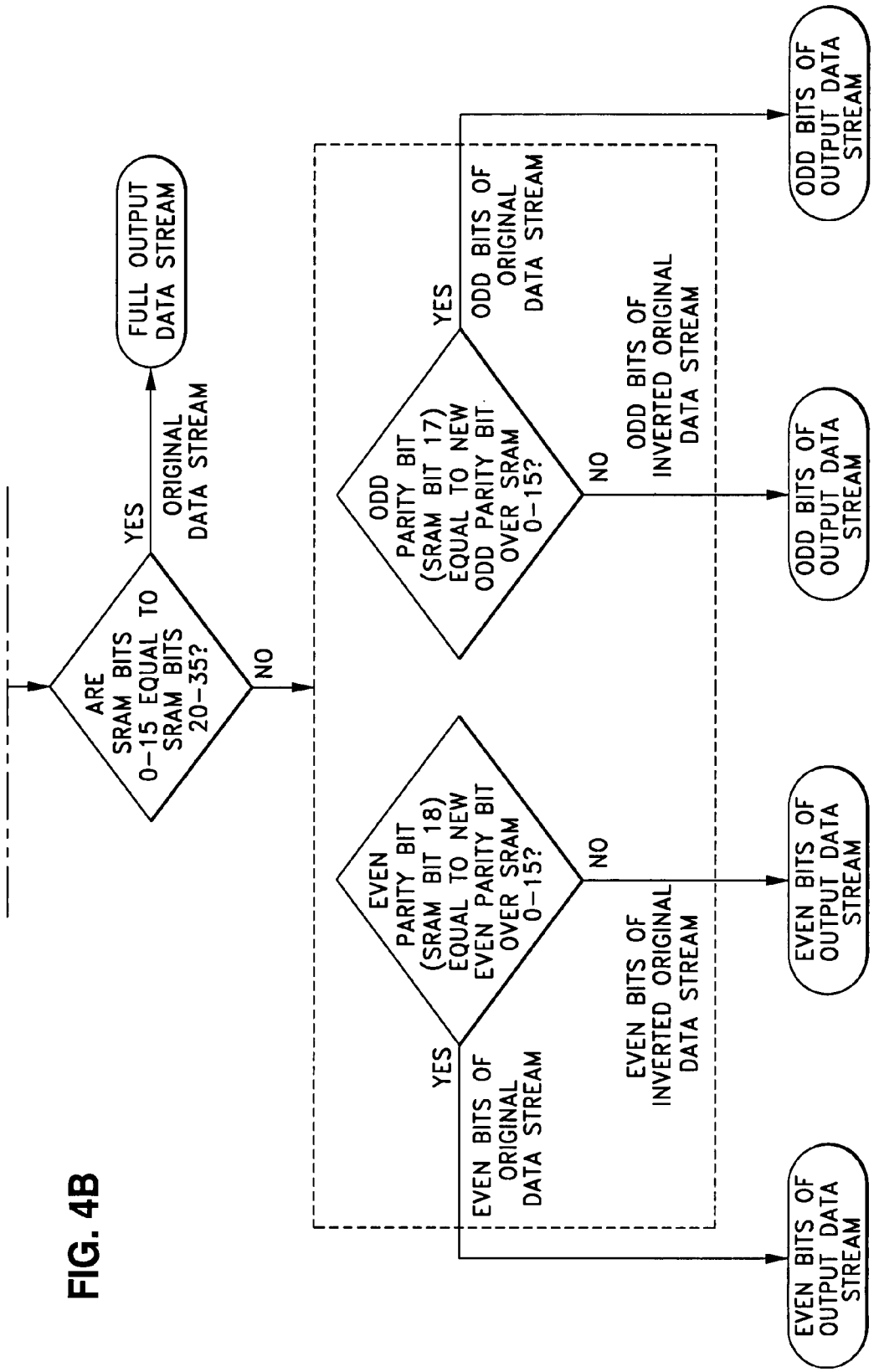
FIG. 4 is a flow diagram illustrating the process of multiple bit error detection and correction, according to the present invention.

In Step S605, the original data 14 is stored in a first portion of the SRAM buffer 16. As shown in FIGS. 1 and 4, the original data 14 may be stored in the first 16 bits, or SRAM bits 0-15 of the SRAM buffer 16. Further, the original data stream 14 is inverted, to form a modified data stream 15, and is stored in the last SRAM bits. In the present embodiment, the bits stored in SRAM bits 0-15 are inverted (i.e. changed from 0 to 1, or 1 to 0) and stored in SRAM bits 20-35. The order of the original data stream bits is maintained. This results in bit 20 being the invert of bit 0, bit 21 being the invert of bit 1, and so on. If the data stream is 16 bits, and the SRAM buffer 16 is 36 bits wide, then two bits, SRAM bit 16 and SRAM bit 19, will be unused. These unused bits will be treated as a buffer for the multi-bit upset mitigation. The unused bits will be assigned a 0 value to ensure storing of the bits will not be interrupted by having an unused bit. The location of the unused bits has no impact on performance. In additional embodiments, unused bits are located in different locations. Also, the parity bits may be in other locations to preserve the error correction capabilities of the invention.

As part of step S605, parity bits are calculated. A first even parity bit 18 is determined using bits 0, 2, 4, 6, 8, 10, 12 and 14 of a 16 bit data stream, and is stored in bit 18 of the SRAM buffer 16. The first even parity bit 18 is determined by checking for an even number of 1s across the selected data bits. The resulting first even parity bit 18 is then stored in SRAM bit 18. If there is an even number of 1s, then a "1" is stored in the SRAM buffer 16 in the location assigned to the first even parity bit 18. If there is an odd number of 1s, then a "0" is stored in the SRAM buffer 16 in the location assigned to the first even parity bit 18.

A first odd parity bit 20 is also determined and stored in the SRAM buffer 16. The first odd parity bit 20 is calculated over bits 1, 3, 5, 7, 9, 11, 13 and 15 of a 16 bit data set. The first odd parity bit 20 is determined by checking for an odd number of 1s across the selected data bits. The resulting first odd parity bit 20 is then stored in SRAM bit 17. If there is an odd number of 1s, then a "1" is stored in the SRAM buffer 16 in the location assigned to the first odd parity bit 20. If there is an even number of 1s, then a "0" is stored in the SRAM buffer 16 in the location assigned to the first odd parity bit 20.

After all of the data is stored, at a later time read out from the SRAM buffer may be required. In step S606, a second even parity bit 19 is determined using bits 0, 2, 4, 6, 8, 10, 12 and 14 of the SRAM data bits 0-15. The second even parity bit 19 is determined by checking for an even number of 1s across the selected data bits. If there is an even number of 1s, then a "1" is the value given to the second even parity bit 19. If there is an odd number of 1s, then a "0" is the value given to the second even parity bit 19.

A second odd parity bit 21 is also determined. The second odd parity bit 21 is calculated over bits 1, 3, 5, 7, 9, 11, 13 and 15 of the SRAM data bits 0-15. The second odd parity bit 21 is determined by checking for an odd number of 1s across the selected data bits. If there is an odd number of 1s, then a "1" is assigned as the value of the second odd parity bit 21. If there is an even number of 1s, then a "0" is assigned as the value of the second odd parity bit 21.

In step S607, error detection and correction (EDAC) rules are applied at a comparator and parity checker 22. The comparator and parity checker 22 is a reconfigurable computing device known in the art. A check on the accuracy of the data stored in the SRAM buffer 16 occurs via a series of comparisons. This ensures a check on the accuracy of the stored data, and detects any corrections that may be needed to ensure the integrity of the data.

In a first comparison, the original data 14 stored in the SRAM 16 is compared with the modified data bits 15 stored in the SRAM. If the invert of the original data 14 is equal to the modified data 15, Step S609 is completed and the original data 14 in its entirety is selected as the output.

Step S609 may also include a comparison of the first even parity bit 18 which is compared with the second even parity bit 19. If the first even parity bit 18 is equal to the second even parity bit 19, the even bits of the original data stream 14 are selected as the output bits. If the comparisons are not equal, the even bits of the modified data stream 15 is inverted again and output as the correct even digits. The realization is that with a bit upset error, the distance between the two sets will only cause one even digit to be upset at a given time.

The same process is then followed with respect to the odd bits. The first odd parity bit 20 is compared with the second odd parity bit 21. If the first odd parity bit 20 is equal to the second even parity bit 21, the odd bits of the original data stream 14 are selected as the output bits. If the comparisons are not equal, the odd bits of the modified data stream 15 is inverted again and output as the odd even digits. The realization is that with a bit upset error, the distance between the two sets will only cause one even digit to be upset at a given time.

In Step S609, a final data stream 24 is formed. Depending on which comparison in Step S607 is successful, a final data stream 24 of 16 bits is formed. It is possible, that a combination of even bits and odd bits may need to be combined and alternated to form a full 16 bit data stream. Following the combining of the smaller data sets into a full set of data bits, in Step S610, the final data stream is made available as an output.

In another embodiment of the invention, rather than leaving two bits unused (by storing "0" values), the use of two additional parity bits may be used to modify performance and protect against up to four adjacent bits being upset. In this embodiment, the four parity bits would be computed using bits 0, 4, 8, 12; 1, 5, 9, 13; 2, 6, 10, 14; and 3, 7, 11, 15 for storage in SRAM bits 16, 17, 18 and 19, respectively. The number of parity bits and the number of subsequent bits protected from upset may be extended by those skilled in the art, up to the number of bits in the input and subject to the maximum width of the SRAM configuration.

In Step S611, following this method, any two bit errors will be corrected, because the two bits will cause both the even parity and the odd parity to change because of the multi bit upset affecting the two neighboring bits in either the original data stream 14 or in the inverted original data stream. The location of the even parity bit 18, the odd parity bit 20, and the unused bits are also very important. Because of the space between the original data stream 14 and the inverted original data stream, a single multi-bit upset will not be able to affect both sets of data.

Figure 2:
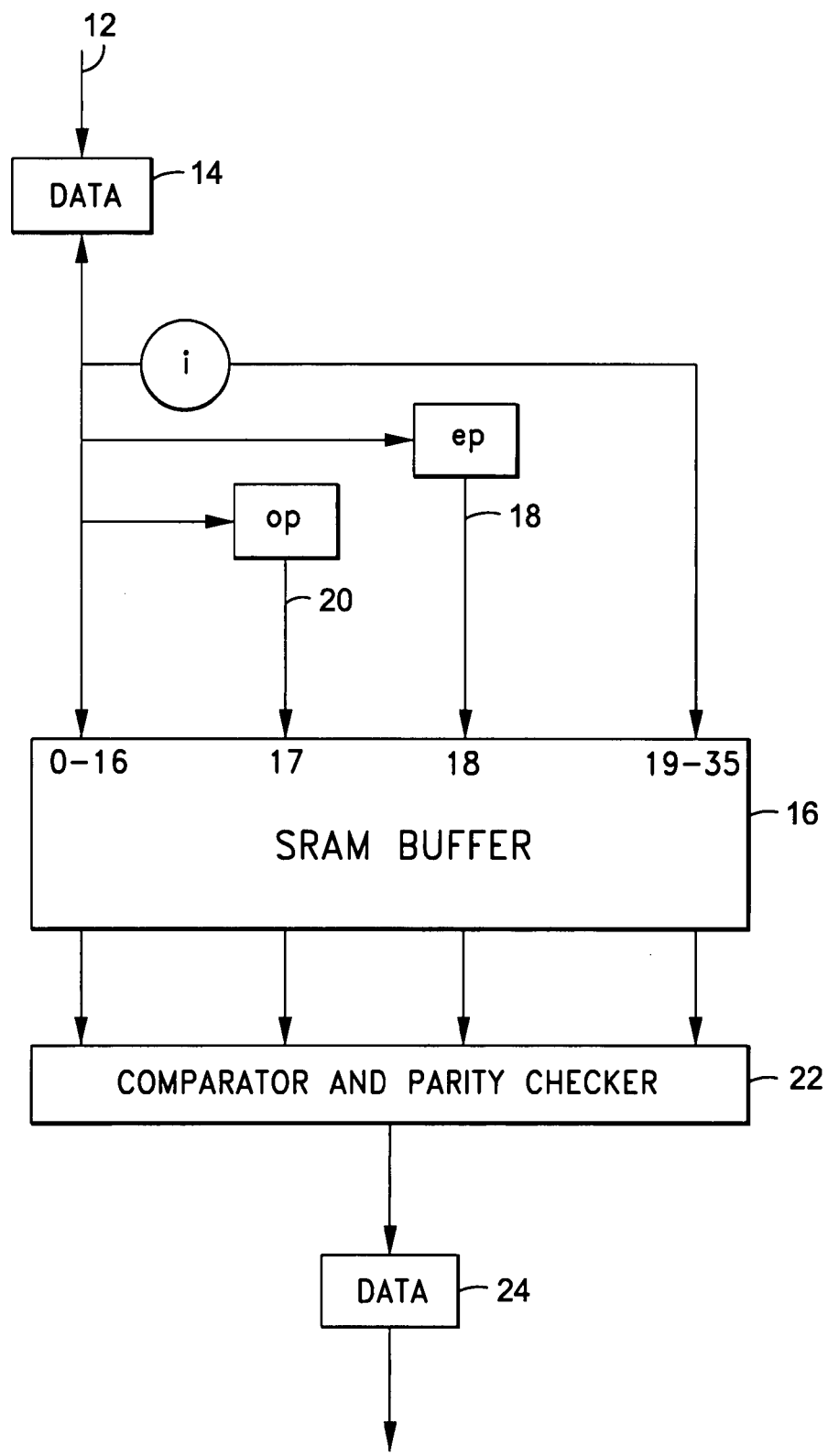
FIG. 2 is a simplified schematic diagram illustrating a system for multiple bit error detection and correction, according to another embodiment of the present invention.

As shown in FIG. 2, in another embodiment of the present invention, an additional error detection process begins (Step S601), and the original data stream 14 of 17 bits may be processed through the error detection and correction system 10. This embodiment protects against the single bit upset. More importantly, however, this embodiment also protects against a multiple bit upset affecting the integrity of the data stream.

The original data stream is accepted through an input 12 (Step S602). In Step S604, an SRAM buffer 16 is partitioned into at least a first portion and a second portion. In Step S605, the original data 14 is stored in a first portion of the SRAM buffer 16. The original data 14 may be stored in the first 17 bits, or SRAM bits 0-16 of the SRAM buffer 16. Further, the original data stream 14 is modified to form a modified data stream 15. In the present embodiment, the bits stored in SRAM bits 0-16 are inverted (i.e. changed from 0 to 1, or from 1 to 0) and stored in SRAM bits 19-35. However, in this current embodiment, the bits are stored in a different order than the original data stream 14. In the creation of the modified data stream 15, the first two bits are switched in order. Bit 1 is stored in SRAM bit 19, bit 0 is stored in SRAM bit 20, while the remaining bits are stored in the same sequence (bit 2 is stored in SRAM bit 21, bit 3 is stored in SRAM bit 22, etc.).

As part of step S605, parity bits are calculated. A first even parity bit 18 is determined using bits 0, 2, 4, 6, 8, 10, 12, 14 and 16 of the 17 bit original data stream 14. The first even parity bit 18 is determined by checking for an even number of 1s across the selected data bits. The resulting even parity bit 18 is then stored in SRAM bit 18. If there is an even number of 1s, then a "1" is stored in the SRAM buffer 16 in the location assigned to the first even parity bit 18. If there is an odd number of 1s, then a "0" is stored in the SRAM buffer 16 in the location assigned to the even parity bit 18.

A first odd parity bit 20 is also determined and stored in the SRAM buffer 16. The odd parity bit 20 is calculated over bits 1, 3, 5, 7, 9, 11, 13 and 15 of the 17 bit data set. The odd parity bit 20 is determined by checking for an odd number of 1s across the selected data bits. The resulting odd parity bit 20 is then stored in SRAM bit 17. If there is an odd number of 1s, then a "1" is stored in the SRAM buffer 16 in the location assigned to the odd parity bit 20. In contrast, if there is an even number of 1s, then a "0" is stored in the SRAM buffer 16 in the location assigned to the first odd parity bit 20.

After all of the data is stored, at a later time read out from the SRAM buffer may be required. In step S606, the second even parity bit 19 is determined by checking for an even number of 1s across the selected data bits. If there is an even number of 1s, then a "1" is the value given to the second even parity bit 19. If there is an odd number of 1s, then a "0" is the value given to the second even parity bit 19.

A second odd parity bit 21 is also determined. The second odd parity bit 21 is determined by checking for an odd number of 1s across the selected data bits. If there is an odd number of 1s, then a "1" is assigned as the value of the second odd parity bit 21. If there is an even number of 1s, then a "0" is assigned as the value of the second odd parity bit 21.

In step S607, error detection and correction (EDAC) rules are applied at a comparator and parity checker 22. The comparator and parity checker 22 is a reconfigurable computing device known in the art. A check on the accuracy of the data stored in the SRAM buffer 16 occurs via a series of comparisons. This ensures a check on the accuracy of the stored data, and detects any corrections that may be needed to ensure the integrity of the data.

In a first comparison, the original data 14 stored in the SRAM 16 is compared with the modified data bits 15 stored in the SRAM. If the invert and reorder of the original data 14 is equal to the modified data 15, Step S609 is completed and the original data 14 in its entirety is selected as the output.

Step S609 may also include a comparison of the first even parity bit 18 with the second even parity bit 19. If the first even parity bit 18 is equal to the second even parity bit 19, the even bits of the original data stream 14 are selected as the output bits. If the comparisons are not equal, the even bits of the modified data stream 15 is inverted again and output as the correct even digits. The realization is that with a bit upset error, the distance between the two sets will only cause one even digit to be upset at a given time.

The same process is then followed with respect to the odd bits. The first odd parity bit 20 is compared with the second odd parity bit 21. If the first odd parity bit 20 is equal to the second even parity bit 21, the odd bits of the original data stream 14 are selected as the output bits. If the comparisons are not equal, the odd bits of the modified data stream 15 is inverted again and output as the odd even digits. The realization is that with a bit upset error, the distance between the two sets will only cause one even digit to be upset at a given time.

In Step S609, a final data stream 24 is formed. Depending on which comparison in Step S607 is successful, a final data stream 24 of 17 bits is formed. It is possible, that a combination of even bits and odd bits may need to be combined and alternated to form a full 17 bit data stream. Following the combining of the smaller data sets into a full set of data bits, in Step S610, the final data stream is made available as an output.

In Step S611, following this method, any two bit errors will be corrected, because the two bits will cause both the even parity and the odd parity to change because of the multi bit upset affecting the two neighboring bits in either the original data stream 14 or in the inverted original data stream. The location of the even parity bit 18 and the odd parity bit 20 are also very important. Because of the space between the original data stream 14 and the inverted original data stream, a single multi-bit upset will not be able to affect both sets of data.

Figure 3:
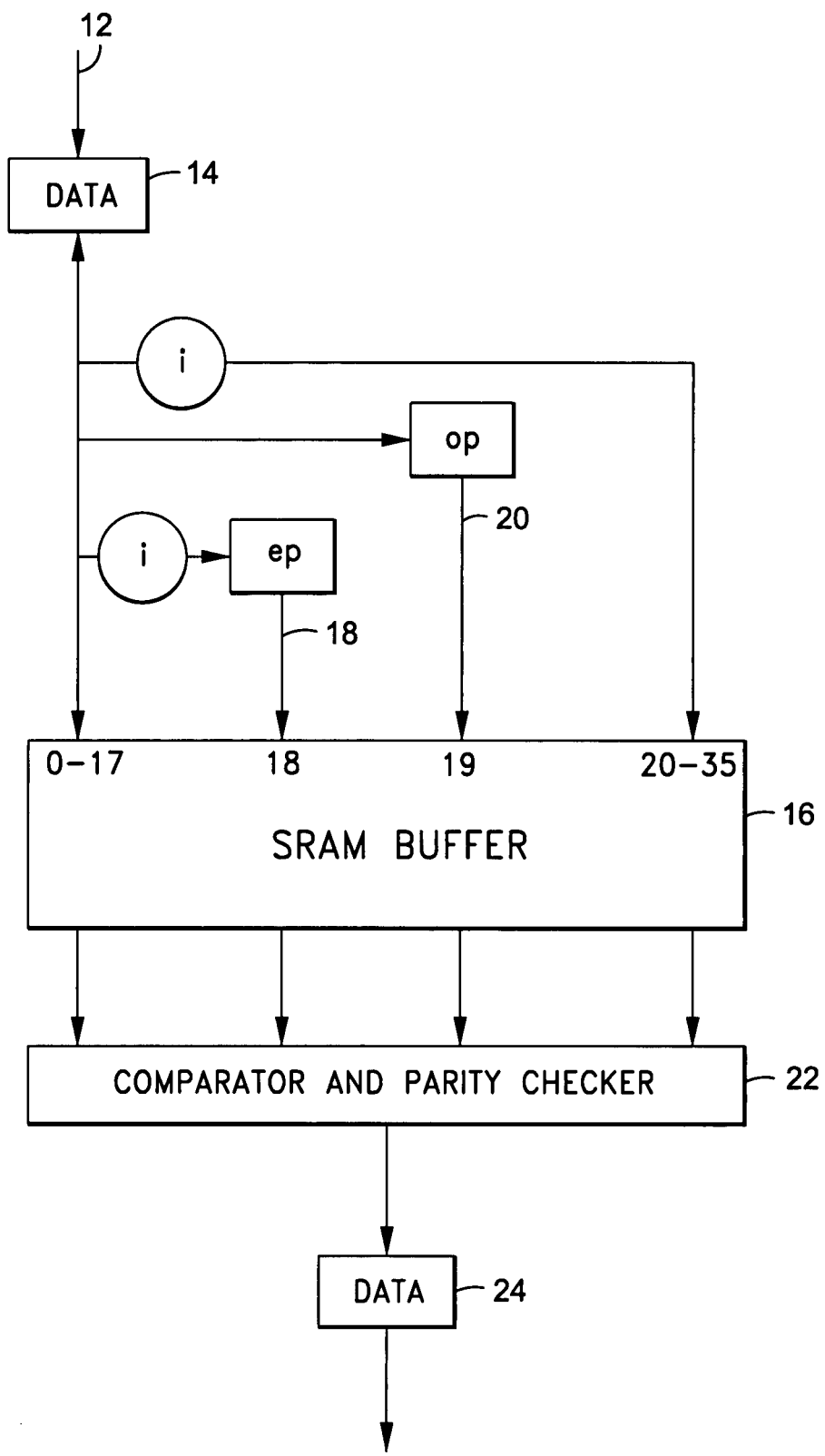
FIG. 3 is a simplified schematic diagram illustrating a system for multiple bit error detection and correction, according to a third embodiment of the present invention.

As shown in FIG. 3, in yet another embodiment of the present invention, a data stream of 18 bits may be processed through the error detection and correction system 10 (Step S601). The original data stream is accepted through an input 12 (Step S602). In Step S604, an SRAM buffer 16 is partitioned into at least a first portion and a second portion. In Step S605, the original data 14 is stored in a first portion of the SRAM buffer 16. The original data 14 may be stored in the first 17 bits, or SRAM bits 0-17 of the SRAM buffer 16. Further, the original data stream 14 is modified to form a modified data stream 15. Further, the original data stream 14 is inverted and stored in the last SRAM bits to form a modified data stream 15. In the present embodiment, the 16 most significant bits (typically the upper bits 0-15) are inverted (i.e., changed from 0 to 1 or 1 to 0) and stored in SRAM bits 20-35.

As part of step S605, parity bits are calculated. A first even parity bit 18 is determined using the inverts of the bits 0, 2, 4, 6, 8, 10, 12, and 14 of the 18 bit original data stream 14. The first even parity bit 18 is determined by checking for an even number of 1s across the selected data bits. The resulting first even parity bit 18 is then stored in SRAM bit 18. If there is an even number of 1s, then a "1" is stored in the SRAM buffer 16 in the location assigned to the first even parity bit 18. If there is an odd number of 1s, then a "0" is stored in the SRAM buffer 16 in the location assigned to the even parity bit 18.

A first odd parity bit 20 is also determined and stored in the SRAM buffer 16. The first odd parity bit 20 is calculated over bits 1, 3, 5, 7, 9, 11, 13 and 15 of the 18 bit data set. The first odd parity bit 20 is determined by checking for an odd number of 1s across the selected data bits. The resulting first odd parity bit 20 is then stored in SRAM bit 19. If there are an odd number of 1s, then a "1" is stored in the SRAM buffer 16 in the location assigned to the odd parity bit 20. If there are an even number of 1s, then a "0" is stored in the SRAM buffer 16 in the location assigned to the odd parity bit 20.

After properly storing the original data stream, the even parity bit, the odd parity bit and the inverted, reorganized original data stream are stored such that upon read out, correction may be made to any errors that occur during the storage. During read out from the SRAM 16, error detection and correction (EDAC) rules are applied at a comparator and parity checker 22 to check the accuracy of the output data stream 21 and make any corrections that may be needed to ensure the integrity of the data.

After all of the data is stored, at a later time read out from the SRAM buffer may be required. In step S606, the second even parity bit 19 is determined by checking for an even number of 1s across the selected data bits. If there is an even number of 1s, then a "1" is the value given to the second even parity bit 19. If there is an odd number of 1s, then a "0" is the value given to the second even parity bit 19.

A second odd parity bit 21 is also determined. The second odd parity bit 21 is determined by checking for an odd number of 1s across the selected data bits. If there is an odd number of 1s, then a "1" is assigned as the value of the second odd parity bit 21. If there is an even number of 1s, then a "0" is assigned as the value of the second odd parity bit 21.

In step S607, error detection and correction (EDAC) rules are applied at a comparator and parity checker 22. The comparator and parity checker 22 is a reconfigurable computing device known in the art. A check on the accuracy of the data stored in the SRAM buffer 16 occurs via a series of comparisons. This ensures a check on the accuracy of the stored data, and detects any corrections that may be needed to ensure the integrity of the data.

In a first comparison, the original data 14 stored in the SRAM 16 is compared with the modified data bits 15 stored in the SRAM. If the invert and reorder of the original data 14 is equal to the modified data 15, Step S609 is completed and the original data 14 in its entirety is selected as the output.

Step S609 may also include a comparison of the first even parity bit 18 with the second even parity bit 19. If the first even parity bit 18 is equal to the second even parity bit 19, the even bits of the original data stream 14 are selected as the output bits. If the comparisons are not equal, the even bits of the modified data stream 15 is inverted again and output as the correct even digits. The realization is that with a bit upset error, the distance between the two sets will only cause one even digit to be upset at a given time.

The same process is then followed with respect to the odd bits. The first odd parity bit 20 is compared with the second odd parity bit 21. If the first odd parity bit 20 is equal to the second even parity bit 21, the odd bits of the original data stream 14 are selected as the output bits. If the comparisons are not equal, the odd bits of the modified data stream 15 is inverted again and output as the odd even digits. The realization is that with a bit upset error, the distance between the two sets will only cause one even digit to be upset at a given time.

In Step S609, a final data stream 24 is formed. Depending on which comparison in Step S607 is successful, a final data stream 24 of 18 bits is formed. It is possible that even bits and odd bits may need to be combined and alternated to form a full 18 bit data stream. The two least significant bits (typically bits 16-17) are used directly from the SRAM since those two bits are not duplicated or protected against upset. Following the combining of the smaller data sets into a full set of data bits, in Step S610, the final data stream is made available as an output.

In Step S611, following this method, any two bit errors in the sixteen most significant bits will be corrected, because the two bits will cause both the even parity and the odd parity to change because of the multi bit upset affecting the two neighboring bits in either the original data stream 14 or in the inverted original data stream. The location of the even parity bit 18 and the odd parity bit 20 are also very important.

Because of the space between the original data stream 14 and the inverted original data stream, a single multi-bit upset will not be able to affect both sets of data.

While the specific embodiments have been illustrated and described, numerous modifications come to mind without significantly departing from the spirit of the invention. Thus, the scope of protection is only to be limited by the scope of the accompanying Claims.

What is claimed is:

1. A computer-readable storage medium in which is stored a program for correcting bit errors, said program comprising codes for permitting the computer to perform:
    a receiving step for receiving original data, the original data having a plurality of data bits;
    a partitioning step for partitioning a memory buffer into a first portion and a second portion;
    a first storing step for storing the original data in the first portion of the memory buffer;
    a modifying step for modifying the original data into modified data;
    a second storing step for storing the modified data in the second portion of the memory buffer;
    a comparing step for comparing the original data stored in the first portion of the memory buffer with the modified data stored in the second portion of the memory buffer;
    a combining step for combining the original data and the modified data to create a final data stream; and,
    an outputting step for outputting the final data stream.

2. The computer-readable storage medium according to claim 1, wherein the memory buffer is a SRAM buffer.

3. The computer-readable storage medium according to claim 1, wherein the modifying step includes inverting original data.

4. The computer-readable storage medium according to claim 1, wherein the modifying step includes rearranging original data.

5. The computer-readable storage medium according to claim 1, wherein the comparing step is performed on a reconfigurable computing device.

6. The computer-readable storage medium according to claim 5, wherein the reconfigurable computing device comprises at least one field programmable gate arrays.

7. A method for detecting and correcting bit errors, comprising the steps of:
    receiving original data, the original data having a plurality of data bits;
    partitioning a memory buffer into a first portion and a second portion;
    storing the original data in the first portion of the memory buffer;
    modifying the original data into modified data;
    storing the modified data in the second portion of the memory buffer;
    comparing the original data stored in the first portion of the memory buffer with the modified data stored in the second portion of the memory buffer;
    combining the original data and the modified data to create a final data stream; and,
    outputting the final data stream.

8. The method for detecting and correcting bit errors according to claim 7, wherein the memory buffer is a SRAM buffer.

9. The method according to claim 7, wherein the modifying step includes inverting original data.

10. The method according to claim 7, wherein the modifying step includes rearranging original data.

11. A computer-readable storage medium in which is stored a program for correcting bit errors, said program comprising codes for permitting the computer to perform:
    a receiving step for receiving original data, the original data having a plurality of data bits;
    a first calculating step for calculating a first even parity bit and a first odd parity bit based on the received original data;
    a storing step for storing the original data in a memory buffer;
    a second calculating step for calculating a second even parity bit and a second odd parity bit based on the stored original data;
    a comparing step for comparing the first even parity bit with the second even parity bit, and comparing the first odd parity bit with the second odd parity bit; and,
    an outputting step for outputting a final data stream.

12. The computer-readable storage medium according to claim 11, wherein the memory buffer is a SRAM buffer.

13. The computer-readable storage medium according to claim 11, wherein the comparing step is performed on a reconfigurable computing device.

14. The computer-readable storage medium according to claim 13, wherein reconfigurable computing device comprises at least one field programmable gate array.

* * * * *